United States Patent
Nouxet et al.

(10) Patent No.: US 9,495,798 B2
(45) Date of Patent: Nov. 15, 2016

(54) METHOD AND DEVICE FOR PRODUCING A FINITE ELEMENT MODEL

(75) Inventors: Daniel Nouxet, Toulouse (FR); Patrick Sarouille, Toulouse (FR)

(73) Assignee: AIRBUS OPERATIONS (S.A.S.), Toulouse (FR)

( * ) Notice: Subject to any disclaimer, the term of this patent is extended or adjusted under 35 U.S.C. 154(b) by 47 days.

(21) Appl. No.: 13/046,272

(22) Filed: Mar. 11, 2011

(65) Prior Publication Data

US 2011/0218785 A1    Sep. 8, 2011

Related U.S. Application Data

(63) Continuation of application No. PCT/FR2009/051716, filed on Sep. 11, 2009.

(30) Foreign Application Priority Data

Sep. 12, 2008  (FR) ...................... 08 56169

(51) Int. Cl.
| | |
|---|---|
| *G06F 7/60* | (2006.01) |
| *G06F 17/10* | (2006.01) |
| *G06T 17/20* | (2006.01) |
| *G06F 17/50* | (2006.01) |

(52) U.S. Cl.
CPC ........... *G06T 17/20* (2013.01); *G06F 17/5018* (2013.01)

(58) Field of Classification Search
CPC .............. G06F 17/5018; G06F 17/50; G06F 17/5009; G06T 17/20
USPC .......................................................... 703/2
See application file for complete search history.

(56) References Cited

U.S. PATENT DOCUMENTS

| | | | | |
|---|---|---|---|---|
| 4,953,094 | A * | 8/1990 | Letcher, Jr. .................... | 700/182 |
| 6,456,289 | B1 * | 9/2002 | O'Brien .................. | G06T 13/20 |
| | | | | 345/473 |
| 2004/0167757 | A1 * | 8/2004 | Struijs ................. | G06F 17/5018 |
| | | | | 703/2 |
| 2006/0052990 | A1 * | 3/2006 | Iimori .............................. | 703/7 |

(Continued)

FOREIGN PATENT DOCUMENTS

WO    WO 93/12500    6/1993

OTHER PUBLICATIONS

Rondeau, Dave et al., "The Primary Structure of Commercial Transport Aircraft Wings: Rapid Generation of Finite Element Models Using Knowledge-Based Methods", 1999, British Aerospace Airbus Limited.*

(Continued)

*Primary Examiner* — Cedric D Johnson
(74) *Attorney, Agent, or Firm* — Jenkins, Wilson, Taylor & Hunt, P.A.

(57) ABSTRACT

A finite-element model modeling a geometrical entity, is created by means of a computer in the following way At least one property data and at least a positioning identifier are acquired by means of an interface of the computer in order to store these in a memory of the computer. The positioning identifier allows identifying a position of the property data on the geometrical entity. A correspondence is established between the positioning identifier and at least an element of the finite-element model. Preferably, the property data is linked with the element of the finite-element model for which a correspondence with the positioning identifier of the property data was established.

12 Claims, 10 Drawing Sheets

(56) References Cited

U.S. PATENT DOCUMENTS

2008/0312880 A1* 12/2008 McLuckie .................. 703/1
2009/0012758 A1*  1/2009 Sawada ..................... 703/2

OTHER PUBLICATIONS

Zhou J.M. et al., "Automatic Generation of 3D Meshes for Complicated Solids", Mar. 1992, IEEE Transactions on Magnetics, vol. 28, No. 2.*

Dolbow, John et al., "An Extended Finite Element Method for Modeling Crack Growth with Frictional Contact", 2001, Computer Methods Appl. Mech. Engineering 190, Elsevier Science B.V.*

Sukumar, N. et al., "Extended Finite Element Method and Fast Marching Method for Three-Dimensional Fatigue Crack Propagation", 2003, Engineering Fracture Mechanics 70, Elsevier Science Ltd.*

International Search Report for PCT/FR2009/051716 dated Sep. 11, 2009.

Ellyin et al., "3-D Modelling of Cyclically Loaded Composite Patch Repair of a Cracked Plate," *Composite Structure*, Elsevier Science Ltd., vol. 78, No. 4, Dec. 6, 2006.

Liang J. et al., "Synthesis of Consolidated Data Schema for Engineering Analysis from Multiple Step Application Protocols," *Computer Aided Design*, Elsevier Publishers BV., vol. 31, No. 7, Jun. 1, 1999.

* cited by examiner

METHOD AND DEVICE FOR PRODUCING A FINITE ELEMENT MODEL

CROSS-REFERENCE TO RELATED APPLICATIONS

This application is a continuation of and claims priority to PCT/FR2009/051716 filed Sep. 11, 2009 and patent application Ser. No. FR 0856169, filed Sep. 12, 2008, the entire disclosures of which are herein incorporated by reference.

TECHNICAL FIELD

The present invention relates the realization of a finite-element model and, more particularly, to a method and a device allowing property data to be applied independently of the granularity of a finite-element model.

BACKGROUND

Modeling by finite elements is nowadays an established technique. Such modeling allows numerically calculating the behavior of objects, which may be very complex. Modeling by finite elements is based on a space division according to a grid made up of finite elements. In addition, during the creation of a finite-element model, a property data set of a modeled entity is generally directly linked with elements of the finite-element model. The property data can define, for example, physical properties of the modeled entity. Such linking of the property data with the finite-element model makes the property data dependant on the granularity on the finite-element model.

In addition, the use of finite-element models is current for the design of complex units, such as aircrafts. Such units require handling complex finite-element models. For example, the finite-element model of an aircraft section, such as the fuselage center section, can comprise more than 33,000 finite elements. Given that a property data set is generally associated with each finite element, it follows that important volumes of property data must be handled for the finite-element model in its entirety.

Traditionally, the design of complex units, such as aircrafts, is made in an iterative way, by successively increasing the granularity of the finite-element model. In other words, the number of finite elements of the finite-element model is modified with each stage of the design. For example, the granularity of the finite-element model is modified as a function of calculations that need to be made, of construction materials and of construction principles used. Consequently, the property data, which are directly dependant on a particular granularity of the finite-element model, must entirely be recreated with each change of the granularity of the finite-element model. A data property set must be created even if the new property data linked to a new finite-element model are identical to the property data linked to a finite-element model on which the new finite-element model is based. This constraint is due to the fact that the property data are linked to the finite-element model by means of a number. This number will be different if the granularity of the model by elements changes, making that there is no possibility of establishing a link between different sets of property data.

Insofar as the property data can be very voluminous, and that, moreover, the creation of the property data requires human intervention at several stages, there will be important constraints, which are reencountered with each iteration of the design, making it impossible to modify the level of granularity of the finite-element model at any time, and accentuating delays in the design process.

SUMMARY

There exists a need to create finite-element models in a relatively fast and flexible way.

The present invention allows solving at least one of the problems identified hereinbefore.

An object of the invention is thus a method for the realization of a finite-element model by means of a computer, the finite-element model including at least an element and modeling a geometrical entity, wherein the method comprises the steps of:

acquiring at least one property data and at least one positioning identifier by means of an interface of said computer in order to store said at least one property data and said at least one positioning identifier in a memory of said computer, said at least one positioning identifier allowing identifying a position of said at least one property data on said geometrical entity; and establishing a correspondence between said at least one positioning identifier and at least one element of said finite-element model in said memory of said computer.

Such a method allows making the creation of property data independent of the granularity of a finite-element model. The method also allows preserving property data information throughout a process of improving a finite-element model.

In a particular embodiment, the method further comprises a step of linking said at least one property data with said at least one element of said finite-element model for which a correspondence with said positioning identifier of said at least one property data was established in said memory of said computer.

In a particular embodiment, the method further comprises the step of modifying by means of said computer said at least one property data and/or said positioning identifier according to a rule of correspondence.

In another particular embodiment, the method further comprises the step of generating by means of said computer at least one property data and/or a positioning identifier according to a rule of correspondence.

In a particular embodiment, said rule of correspondence is determined by a user by means of said interface of said computer.

In another particular embodiment, said rule of correspondence is selected among a group comprising: an interpolation, a logarithmic interpolation, an average, a weighted average, a calculation thickness based on a voluminal expression of a predetermined zone and an average in proportion to distances between two values.

In a particular embodiment, a modification of said at least one element of said finite-element model modifies said at least one property data and/or said positioning identifier according to a rule of correspondence.

In another particular embodiment, a modification of said at least one element of said finite-element model generates at least one property data and/or a positioning identifier according to a rule of correspondence.

In a particular embodiment, a creation of an element of the finite-element model generates at least a property data and/or a positioning identifier.

In a particular embodiment, the step of acquiring said at least one property data by means of said interface of said computer is carried out starting from a finite-element model.

In a particular embodiment, said geometrical entity is selected among a group comprising: a one-dimensional element and a two-dimensional element.

In a particular embodiment, said at least one property data is selected among a group comprising: a normal section, an inertia, a sheared section, a torque, a thickness and a surface value.

The invention also concerns a device comprising means adapted to implement each step of the method described hereinbefore.

The invention also concerns a computer program comprising code instructions for executing the steps described hereinbefore, when said program is executed by a computer.

In a particular embodiment, the program is in the form of a product recorded on a support readable by a computer system, including elements of program code.

BRIEF DESCRIPTION OF THE DRAWINGS

The present invention is illustrated by means of non-limiting examples in the appended figures, in which identical references indicate similar elements.

DETAILED DESCRIPTION

The invention relates to the realization of finite-element models and, more particularly, a method allowing the creation of property data to be independent of the granularity of a finite-element model.

Figure 1:
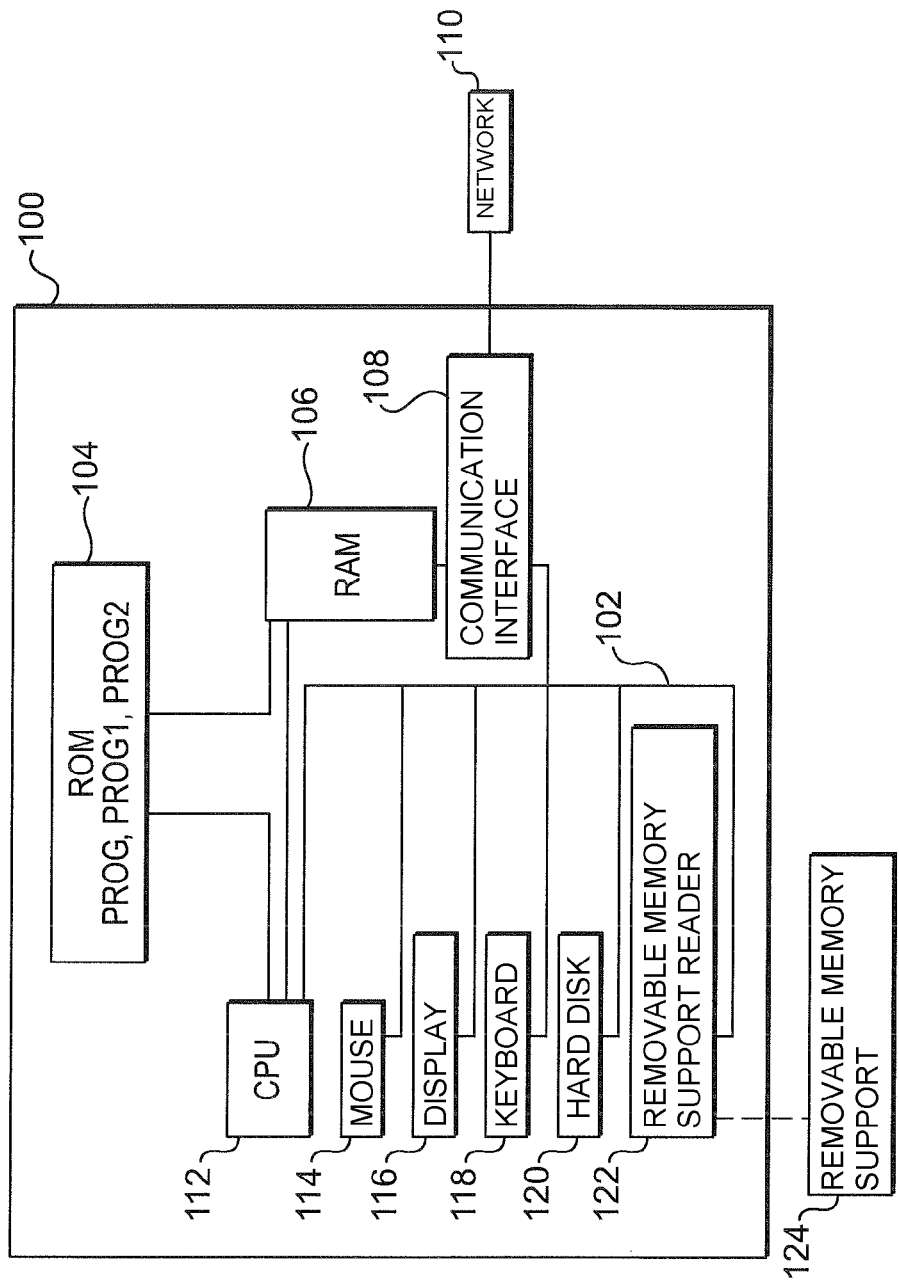
FIG. 1 schematically illustrates an example of apparatus for implementing the invention.

FIG. 1 illustrates an example of an apparatus 100 adapted to implement the invention, such as a micro-computer or a workstation.

Preferably, the apparatus 100 comprises a communication bus 102 to which are connected: a central processing unit 112 such as a microprocessor; a read-only memory 104, which may comprise one or more programs "Prog", "Prog1" and "Prog2"; a random access memory 106, which comprises registers adapted to memorize variables and parameters created and modified during the execution of the above mentioned programs; and a communication interface 108 connected to a distributed communication network 110, for example the Internet or an Intranet network, the interface being able to transmit and receive data.

The apparatus 100 can optionally comprise at least one of the following devices: a screen 116 for visualizing data and/or for use as graphic interface with a user who will be able to interact with the programs according to the invention by means of a keyboard 118 or by means of another device, such as, for example, a mouse 114; a hard drive 120 which can comprise programs and/or data, in particular processed data or data to be processed according to the invention; a reader of removable memory supports 122 adapted to receive a removable memory support 124 and to read there from processed data or to write thereon data processed according to the invention.

The communication bus allows communication and interoperability between the various elements that form part of the apparatus 100 or that are connected thereto. The representation of the bus is not restrictive and, in particular, the central processing unit may communicate instructions to any element of the apparatus 100, either directly or via another element of apparatus 100.

The executable code of the programs allowing apparatus 100 to implement the processes according to the invention can be stored, for example, in the hard drive 120 or in the read-only memory 104.

In a variant, the removable memory support 124, can contain data as well as the executable code of the above mentioned programs which, once read by the apparatus 100, can be stored in the hard drive 120.

Alternatively, the executable code of the programs can be received via the communication network 110, via the interface 108, so as to be stored in a way as described hereinbefore.

The removable memory support can be, for example, a diskette, a compact disc (CD-ROM), or a memory card. Generally, an information storage means, readable by a computer or a microprocessor, integrated or not into the apparatus, possibly removable, and adapted to store one or more programs whose execution allows the implementation of the method according to the invention.

More generally, the programs could be stored in one of the storage means of the apparatus 100 before being executed.

The central processing unit 112 controls execution of the instructions or portions of software code of the programs according to the invention, instructions which are stored in the hard drive 120, in the read-only memory 104 or in the other storage elements mentioned hereinbefore. During the powering, the programs that are stored in a nonvolatile memory, for example in the hard drive 120 or the read-only memory 104, are transferred to the random access memory 106 (RAM), which then contains the executable code of the programs according to the invention, as well as to registers for storing the variables and the parameters necessary for implementing the invention.

It should be noted that the apparatus comprising the device according to the invention can also be a programmed apparatus. The instructions of the programs implementing the invention can be implemented in, for example, an Application-Specific Integrated Circuit (ASIC).

Figure 2:
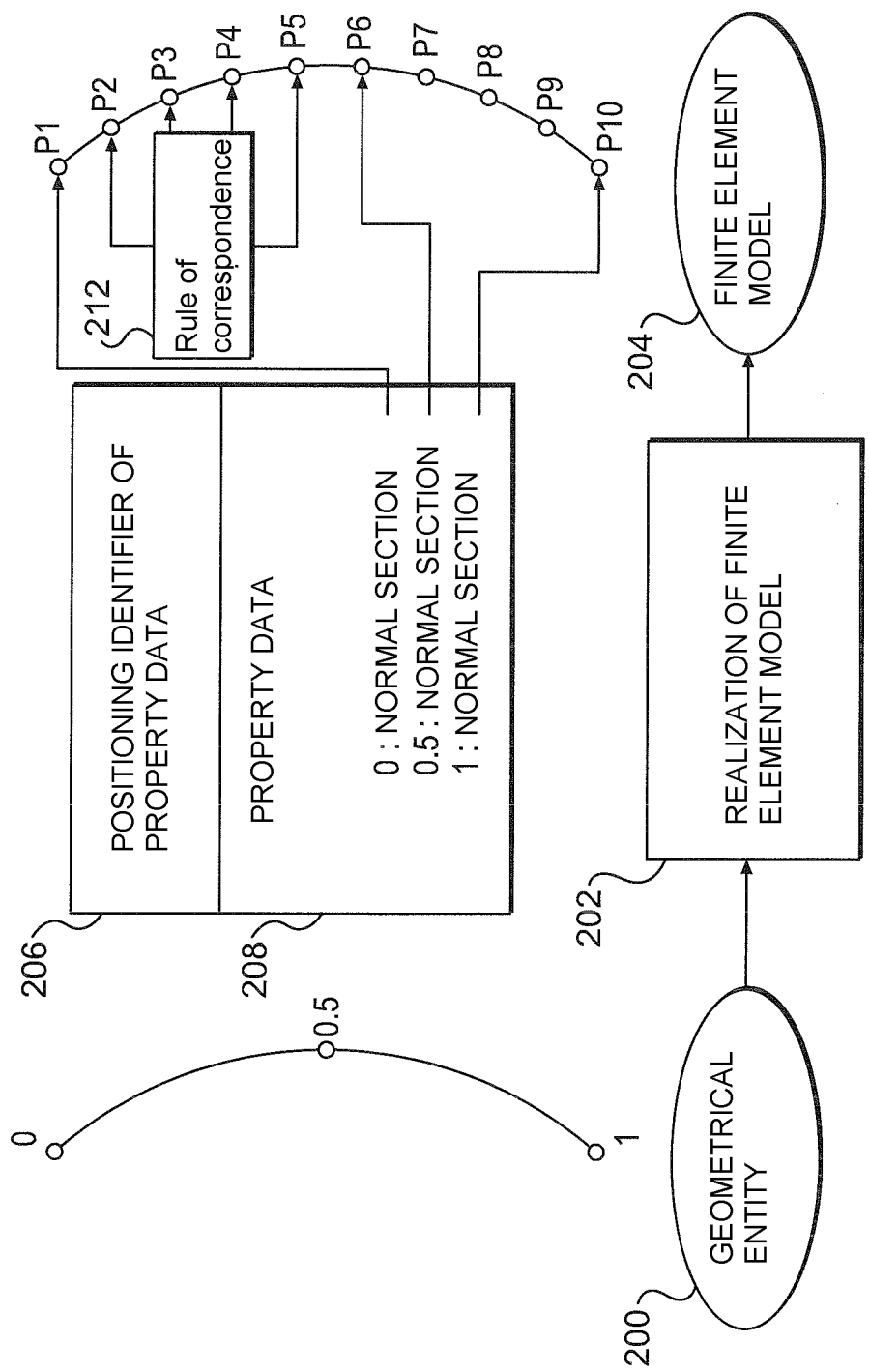
FIG. 2 schematically illustrates an example of linking property data of a geometrical entity in a finite-element model.

FIG. 2 illustrates certain steps carried out by the invention for obtaining a finite-element model 204 of a geometrical entity 200, to which property data 208 are linked, whereby the property data 208 is independent of the finite-element model 204.

In order to do so, the property data 208 are linked to the geometrical entity 200 by means of at least one positioning identifier 206 for the property data. The positioning identifier 206 allows identifying the position of at least one property data 208 on the geometrical entity 200. In this example, the property data 208 are a set of values representing the normal section of a one-dimensional element. It should be noted that the property data 208 may comprise information concerning the physical characteristics of an element, or data useful for the creation of a grid, for example, data facilitating the implementation of a topological classification, or facilitating the study by any device (optimization, vibration, heat, etc), or facilitating traceability (source of the physical data: section in solid, interpolation, specific study, assumption, validation of a plane, etc). Such information can be, for example, the normal section, inertia, the sheared section, a torque or a thickness. In addition, the geometrical entity 200 can be any entity that can be modeled, in particular by means of geometrical coordinates. As example, the geometrical entity 200 can represent an element of simple complexity, with one or two dimensions, such as a beam or a surface, or even an element of greater complexity, made up of, for example, a combination of elements of simple complexity, such as a section of aircraft.

During the realization of the finite-element model 202, an acquisition of the property data 208 and of a positioning identifier 206 is carried out. The positioning identifiers 206 identify the position of the property data 208 on the geometrical entity 200 on the basis of which a finite-element model 204 is realized. Thus, the property data 208 are independent of the finite-element model 204, insofar as the positioning of the property data 208 is established with regard to the geometrical entity 200, by means of at least one positioning identifier 206.

The property data 208 are linked to the elements of the finite-element model 204 by resorting to the positioning identifier 206 in order to identify the elements of the finite-element model 204 to which the property data 208 are to be linked. Thus, a correspondence is established between the positioning identifier 206 of the geometrical entity 200 and the elements of the finite-element model 204 of the geometrical entity 200. Once the correspondence between the positioning identifiers 206 and the elements of the finite-element model 204 has been established, the property data 208 are linked with the elements of the finite-element model 204 for which a correspondence with the positioning identifiers 206 of the property data 208 was established.

In addition, during the establishment of the correspondence between the positioning identifiers 206 and the elements of the finite-element model 204, a rule of correspondence 212 can be used. The rule of correspondence allows modifying or creating a new value of property data, which is then linked with the finite-element model 204. Moreover, the rule of correspondence 212 also allows modifying or creating a positioning identifier for the value of the property data modified or created. Thus, by modifying or creating the positioning identifier, the rule of correspondence 212 can update the property data with respect to the geometrical entity 200. The rule of correspondence 212 can modify or create one or more new values of property data by using the values of already known property data 208. Various calculation methods can be applied to the values of already known property data 208 in order to modify or create the new values of property data. As example, these calculation methods can be a linear interpolation, a logarithmic interpolation, an average or a weighted average.

In this example, the property data 208 comprise three values representing the normal section of an element and a positioning identifier 206 allowing identifying the part of the geometrical entity 200 to which the property data 208 are linked. A correspondence between the positioning identifier 206 and the elements of the finite-element model 204 is then established in order to identify with which or to which elements of the finite-element model 204 the property data 208 are to be linked. In this example, the three values of the normal section of the geometrical entity 200, respectively 0, 0.5 and 1 are linked to elements at positions P1, P6 and P10, respectively, of the finite-element model 204. The positions of the elements P1 to P10 are positions resulting from a grid refinement. In addition, in this example, the rule of correspondence 212 is used in order to generate property data which are linked to elements with the positions P2, P3, P4 and P5 of the finite-element model 204.

Figure 3:
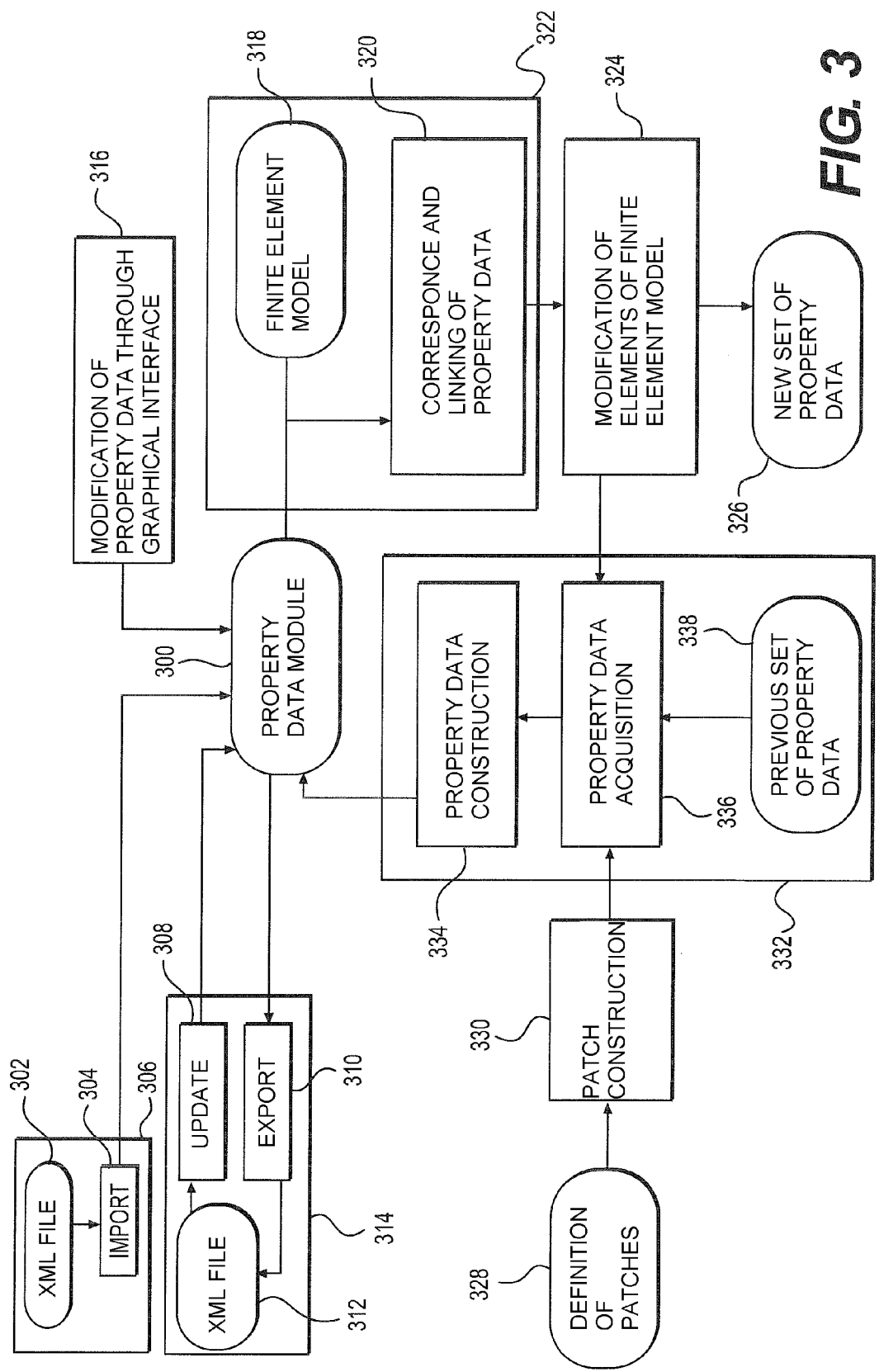
FIG. 3 schematically illustrates an example of various modules for using the invention.

FIG. 3 schematically illustrates an example of various modules allowing use of the invention. The property data module 300 allows managing the property data for linking to a finite-element model 318 that has been generated by means of, for example, a computer aided design (CAD) software or computer-aided engineering (CAE) software. The property data module 300 allows the implementation of this invention in commercially available CAD or CAE software, such as, as example, CATIA, developed by the company Dassault Systèmes coupled to a software such as SIMXpert, developed by the company MSC. Software.

The property data can be stored directly in the CAD or CAE software or on an external database. It can be simpler to use the property data in case these data are stored in an external database, particularly if property data is voluminous. Such an external database can be accessible, for example, through an API (Application Programming Interface) thus allowing to build on an open data-processing architecture.

The property data can also be linked to a real geometry or an image of the geometry. Certain CAD or CAE software integrates a module allowing reading a geometry and thus creating an intermediate image of geometry.

The recovery of the property data can be realized by a first recovery method 306 or a second recovery method 332. The first recovery method 306 allows importation 304 of property data contained in an XML file 302. The use of the XML format allows building on a standard organization of data, however other file formats could be employed, like, for example, the CVS format. The second recovery method 332 allows the recovery of property data starting from an existing finite-element model. A preceding data property file 338 is then captured by a property data capturing module 336. Once captured, the property data are then built by a property data construction module 334.

The modification of the property data can be realized, according to a first alternative, by a property data modifying module via the graphic interface 316. The modified property data are then provided to the property data module 300. According to a second alternative, an external file 314 can be used. Using an external file 314 allows providing the property data module 300 with property data created by a property data creation module. As example, this module can be an optimization module, a dimensioning module, or a CAD-calculation linking module or a CAE-calculation linking module. The interaction between the property data creation module and the property data module 300 is done via an XML file 312, which can be modified by an export module 310. An update module 308 allows updating the property data module 300 in order to reflect the modifications applied to the XML file 312 by a property data creation module.

The application of the property data 322 on a finite-element model 318 is carried out by a property data correspondence and linking module 320. The property data correspondence and linking module 320 links the property data of the property data module 300 with the finite-element model 318. The property data correspondence and linking module 320 can use at least one rule of correspondence if, for example, the granularity of the property data of the property data module 300 is different from the granularity of the finite-element model 318.

The finite-element model 318 to which the property data have been linked is modifiable via a finite-element modification module arranged to modify elements of the finite-element model 324. A new data property file 326 is then created. In addition, the modifications are captured by the property data capturing module 336. The new property data are built by the property data construction module 334 which updates the property data module 300.

In addition, the capture of the property data by module 336 can be carried out starting from a patch construction module 330 on the basis of definitions of patches 328. The concept of patch will be detailed somewhat further in this document.

Figure 4:
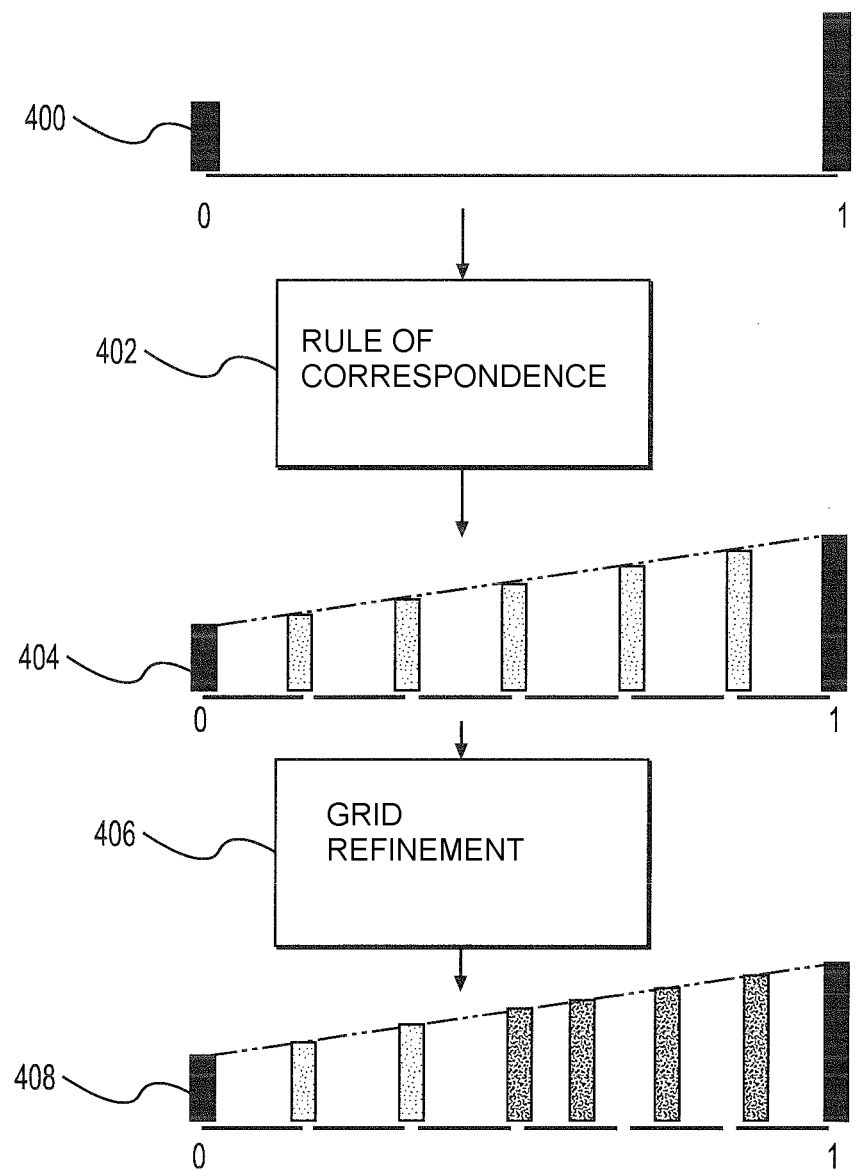
FIG. 4 schematically illustrates a first example of an application of the invention on a one-dimensional element.

FIG. 4 schematically illustrates a first example of the application of the invention on a one-dimensional element, in particular the linking of property data with a finite-element model. For example, a one-dimensional element can be a bar or a beam. In this example, a geometrical entity 400 is an oriented geometrical line having curvilinear coordinates U=0 at the beginning of line and U=1 at the end of the line. In this example, the behavior of the geometrical line in the finite-element model is a bar. The bar is characterized, in this example, by a normal section. Thus, the property data linked to the geometrical entity contain normal section values positioned at various locations on the geometrical entity. In this example, two normal section values form the property data. The positions of these values on the geometrical entity are identified by two positioning identifiers, U=0 and U=1. The two normal section values, $SN_{u=0}$ and $SN_{u=1}$, are positioned at each end of the line. In this example, the value of the normal section is represented by a vertical bar of which the length is proportional to the value.

A rule of correspondence 402 is used during the establishment of a correspondence between the two positioning identifiers, U=0 and U=1, and the elements of a finite-element model 404. However, the granularity of the finite-element model, i.e. the number of elements constituting the finite-element model, being higher than the number of values of the property data, a rule of correspondence 402 is used in order to generate new geometry data values to be linked to the finite-element model 404. In this example, the five bars, positioned between the two bars positioned with each end, represent normal section values interpolated according to a rule of correspondence 402 using a linear interpolation. Thus, a value of normal section is linked to each element of the finite-element model 404.

A grid refinement 406, i.e. an increase amongst elements of a finite-element model 408, is carried out, resulting in the creation of a new element and of a new property data value linked to the new element. In addition, the creation of the new element also modifies values linked to related elements. In this case, a rule of correspondence is used in order to generate the new data value of the new element. An update of the values of the property data linked to the related elements, which are modified as a consequence of the creation of the new element, is also carried out. Thus, the property data are updated with each modification or creation of elements of the finite-element model.

Figure 5:
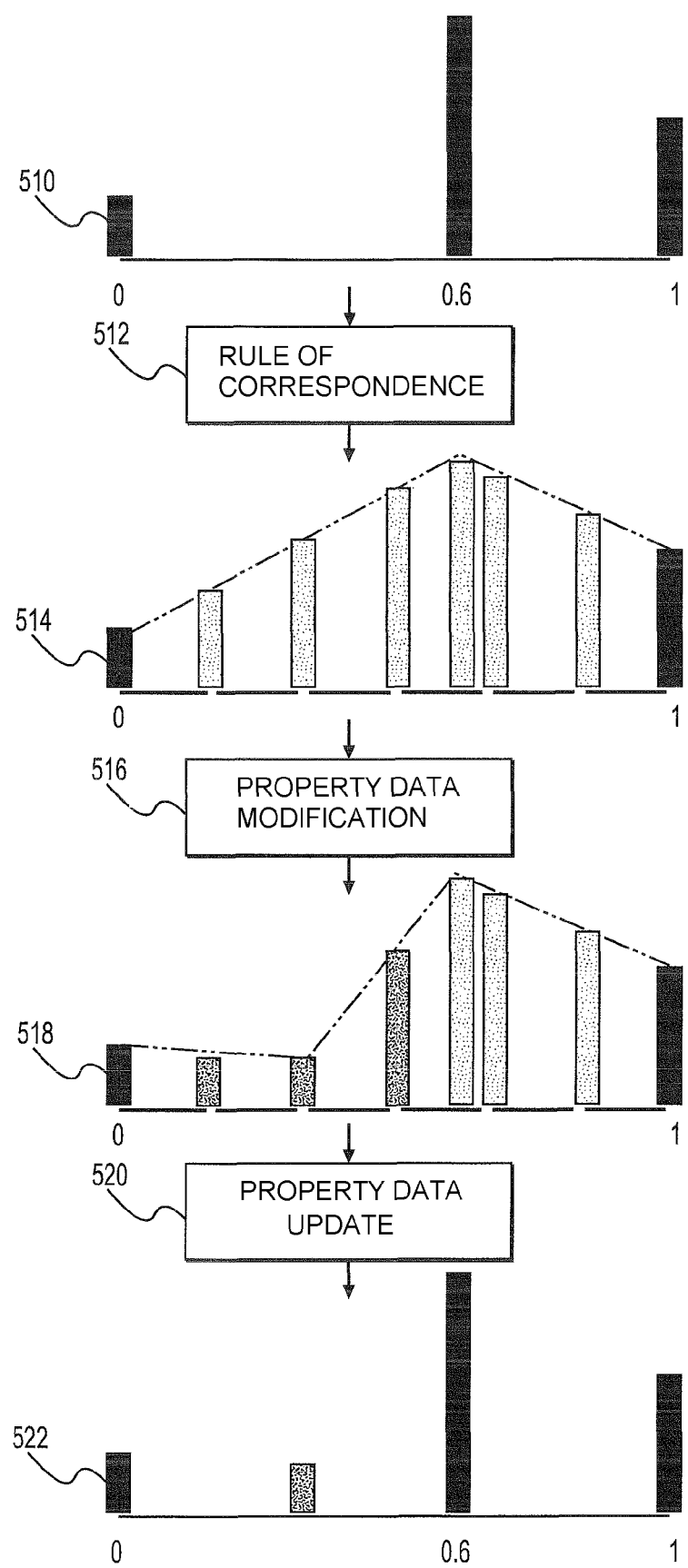
FIG. 5 schematically illustrates a second example of an application of the invention on a one-dimensional element.

FIG. 5 schematically illustrates a second example of the application of the invention on a one-dimensional element, in particular the bijective update of the property data between the geometrical entity and the finite-element model. In this example, a geometrical entity 510 is an oriented geometrical line having curvilinear coordinates U=0 at the beginning of line and U=1 at the end of the line. In this example, the behavior of the geometrical line in the finite-element model is a bar. The bar is characterized, in this example, by a normal section. Thus, the property data linked to the geometrical entity contain normal section values positioned at various locations on the geometrical entity. In this example, three normal section values form the property data. The positions of these values on the geometrical entity are identified by three positioning identifiers, U=0, U=0.6 and U=1. The three normal section values, $SN_{u=0}$, $SN_{u=0.6}$ and $SN_{u=1}$, are positioned at U=0, U=0.6 and U=1, respectively. In this example, the normal section value is represented by a vertical bar of which the length is proportional to the value.

A rule of correspondence 512 is used for establishing a correspondence between the three positioning identifiers U=0, U=0.6 and U=1, and the elements of a finite-element model 514. However, in this example, the positioning identifier U=0.6 does not correspond to an element of the finite-element model 514. A choice is then proposed to the user, although it can be considered that this choice can be carried out automatically by the rule of correspondence 512. A new property data value linked to an element of the finite-element model 514 can then be created following a first choice. The value can be established according to the rule of correspondence and starting from the value $SN_{u=0.6}$. Following a second choice, no new property data is created.

A modification of property data 516 is carried out resulting in the modification from a property data value linked to an element of the finite element model 518. In addition, the update of property data 520 leads to the creation of a new property data value and to a positioning identifier of the new value on the geometrical entity 522. Thus, the property data can be updated with regard to the geometrical entity, with each modification or creation of property data value.

Figure 6:
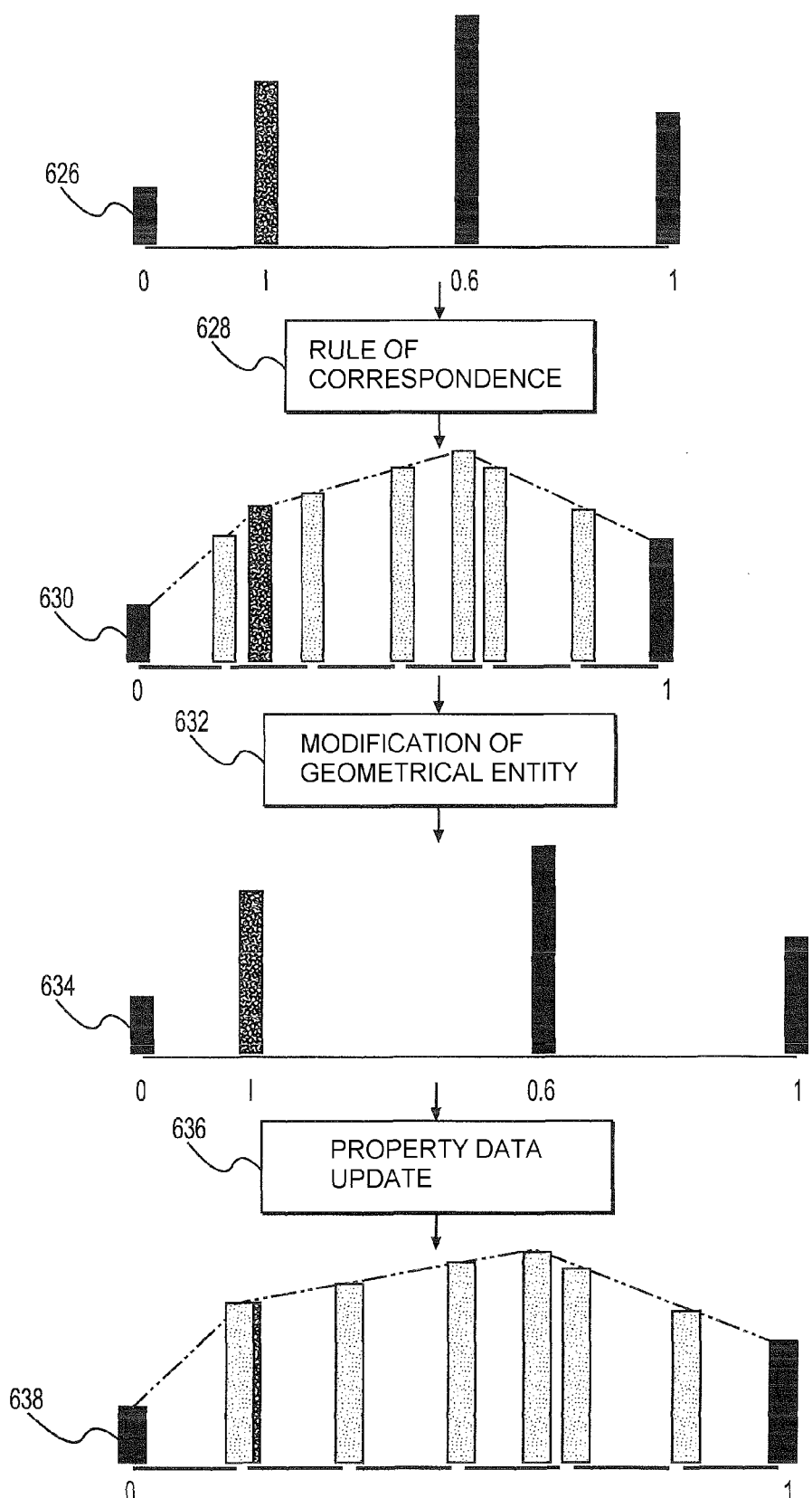
FIG. 6 schematically illustrates a third example of an application of the invention on a one-dimensional element.

FIG. 6 schematically illustrates a third example of the application of the invention on a one-dimensional element, in particular a positioning identifier for property data on the geometrical entity that does not depend on one curvilinear X-coordinate on a geometrical line only. In this example, one of the positioning identifiers depends on the positioning of an external element. In this example, the external element can be a stiffener positioned transversely with respect to the geometrical line.

In this example, a geometrical entity 626 is an oriented geometrical line having curvilinear coordinates U=0 at the beginning of line and U=1 at the end of the line. In this example, the behavior of the geometrical line in the finite-element model is a bar. The bar is characterized, in this example, by a normal section. Thus, the property data linked to the geometrical entity contain normal section values positioned at various places of the geometrical entity. In this example, four normal section values form the property data. The positions of these values on the geometrical entity are identified by three positioning identifiers, U=0, U=0.6 and U=1, as well as a positioning identifier U=I positioned at the intersection of the external element with the geometrical line. The four normal section values, $SN_{u=0}$, $SN_{u=0.6}$, $SN_{u=1}$ and $SN_{u=i}$, are positioned at U=0, U=0.6, U=1 and U=i, respectively. In this example, the normal section value is represented by a vertical bar of which the length is proportional to the value. In addition, the intersection of the external element with the geometrical line can model, for example, a crossing between a vertical stay and a horizontal stiffener of a stiffened panel.

A rule of correspondence 628 is used for establishing a correspondence between the positioning identifiers and the elements of a finite-element model 630, according to the example of application describes previously with reference to FIG. 5.

A modification of the geometrical entity 632 results in a modification of the length of the geometrical line and leads to the geometrical entity 634. The three normal section values $SN_{u=0}$, $SN_{u=0.6}$ and $SN_{u=1}$ then preserve their relative positioning defined by their curvilinear coordinates, U=0, U=0.6 and U=1, respectively. However, the relative positioning of the value of normal section $SN_{u=i}$ and thus the coordinate U=i of the value of normal section is modified.

A finite-element model 638 is then generated, in which the update of the property data 636 is reflected. The update of the property data 636 results in the establishment of a new correspondence between the positioning identifiers U=0, U=0.6, U=1 and U=I and the elements of the finite-element model 638. However, the granularity of the finite-element model 638 being higher than the number of values of the updated property data, a rule of correspondence is used in order to generate new geometry data values to be linked to the finite-element model 638, according to the example of application described previously with reference to FIG. 4.

In the example of FIG. 6, the modification of the geometrical entity 632 concerns the modification of the length of the geometrical line. However, the update of the property data 636 would be carried out in a similar way if the modification of the geometrical entity 632 related to a modification of the positioning of the external element. Thus, it is possible, in this example, to modify the value of the property data according to a positioning with regard to a curvilinear X-coordinate or with regard to the positioning of an external element.

Figure 7:
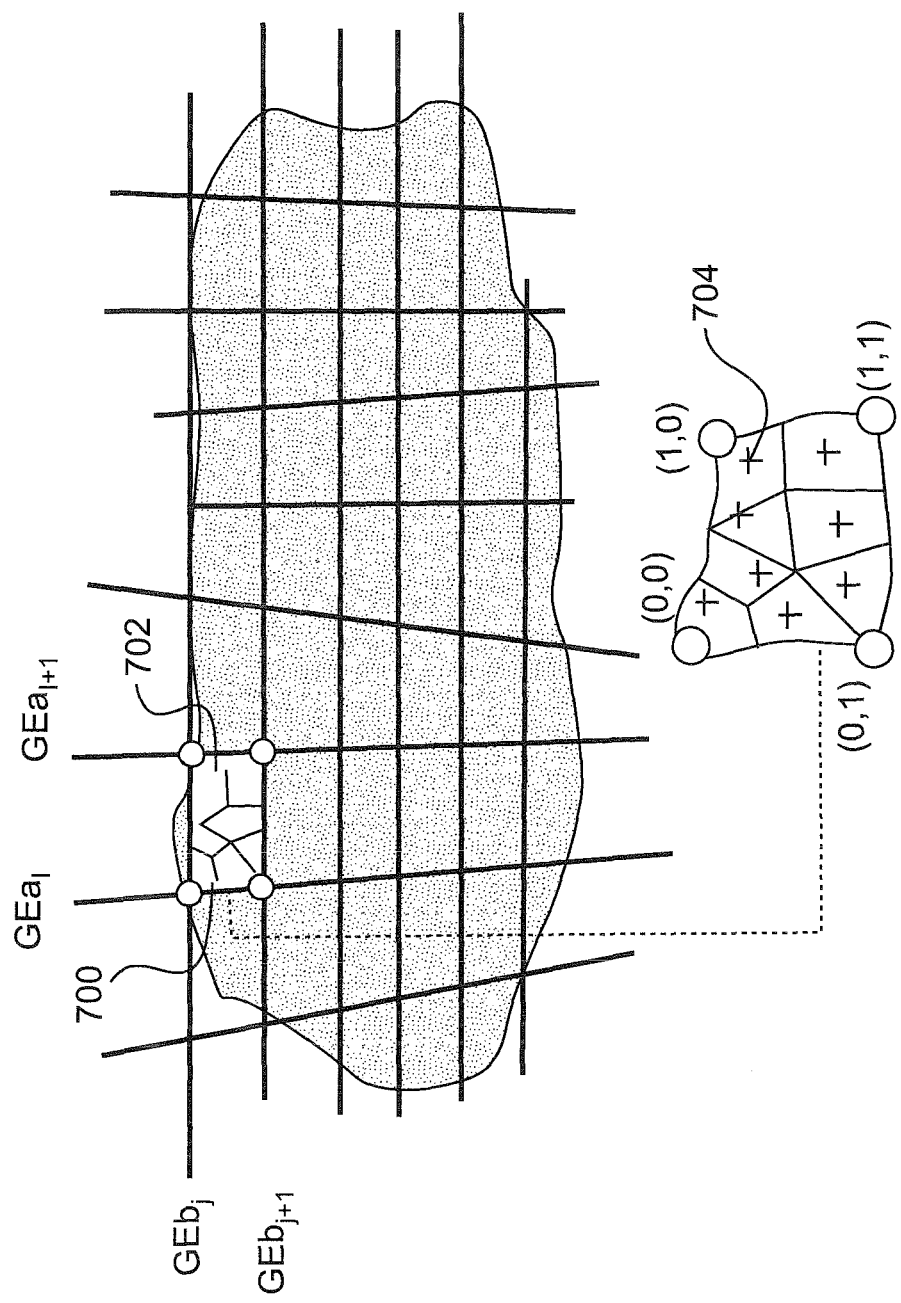
FIG. 7 schematically illustrates a geometrical surface.

FIG. 7 schematically illustrates a geometrical entity representing a surface or, in other words, a geometrical surface, to which property data can be linked. In this example, the identification of the positioning of property data of a geometrical surface can be realized by means of two levels, by means of first and second positioning identifiers for property data.

In this example, a first positioning identifier of property data is based on the cutting of a geometrical surface by a first series of lines GEa identified by an index "i", each line being then identifiable according to the terminology $GEa_i$, $GEa_{i+1}$, etc., and the cutting of the geometrical surface by a second series of lines GEb identified by an index "j", each line being then identifiable according to the terminology $GEb_j$, $GEb_{j+1}$, etc. It then becomes possible to use a surface limited by the lines GEa and GEb as positioning identifier so as to identify the positioning of property data on each portion of the geometrical surface 702.

In addition, it is also possible to use a second positioning identifier for property data, also called localization of property value, allowing localizing on each portion of the geometrical surface 702, identified by an intersection 700, the property data of a surface point 704. In order to do so, it is appropriate to first identify the portion of surface 702 on which the property data of a surface point 704 are, through the positioning identifier based on the intersection 700 of a line $GEa_i$ with a line $GEb_j$. The positioning of the property data of the surface point 704 is then established on this portion of surface through a two-dimensional coordinate system (u, v), where 0≤u≤1 and 0≤v≤1 in this example.

Figure 8:
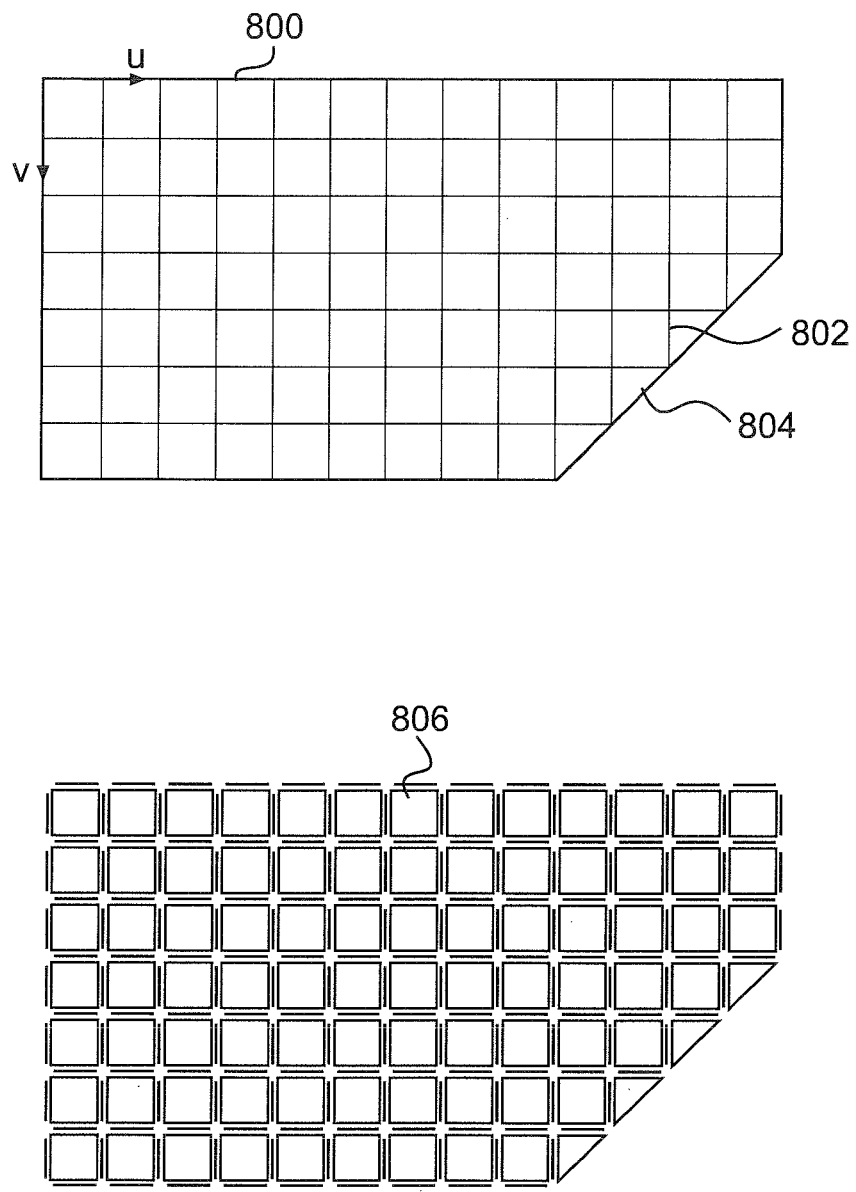
FIG. 8 schematically illustrates a first example of the application of the invention on a two-dimensional element.

FIG. 8 schematically illustrates a first example of the application of the invention on a two-dimensional element, in particular the linking of property data with a finite-element model. For example, a two-dimensional element can be a panel or a hull. In this example, a geometrical entity 800 is an oriented geometrical surface. The property data, which are surface values 804 of the geometrical entity 800 in this example, are positioned by a positioning identifier for surface values. In addition, a plurality of one-dimensional elements 802, for example stiffeners, is laid out on the geometrical entity 800.

In this example, the behavior of the geometrical surface as finite-element model is a plate. The plate is characterized, in this example, by a thickness. Thus, the surface value 804 linked to the geometrical entity contains the thickness value positioned on the geometrical entity. The position of the surface value 804 on the geometrical entity is identified by a surface identifier.

A correspondence between the surface and the elements of the finite-element model 806 is established. The surface value 804 of the geometrical entity 800 is then linked to the finite-element model 806.

The establishment of a correspondence and the linking of the property data of the plurality of one-dimensional elements 802 in the finite-element model 806 are carried out according to the applications described with reference to FIGS. 4 to 6.

Figure 9:
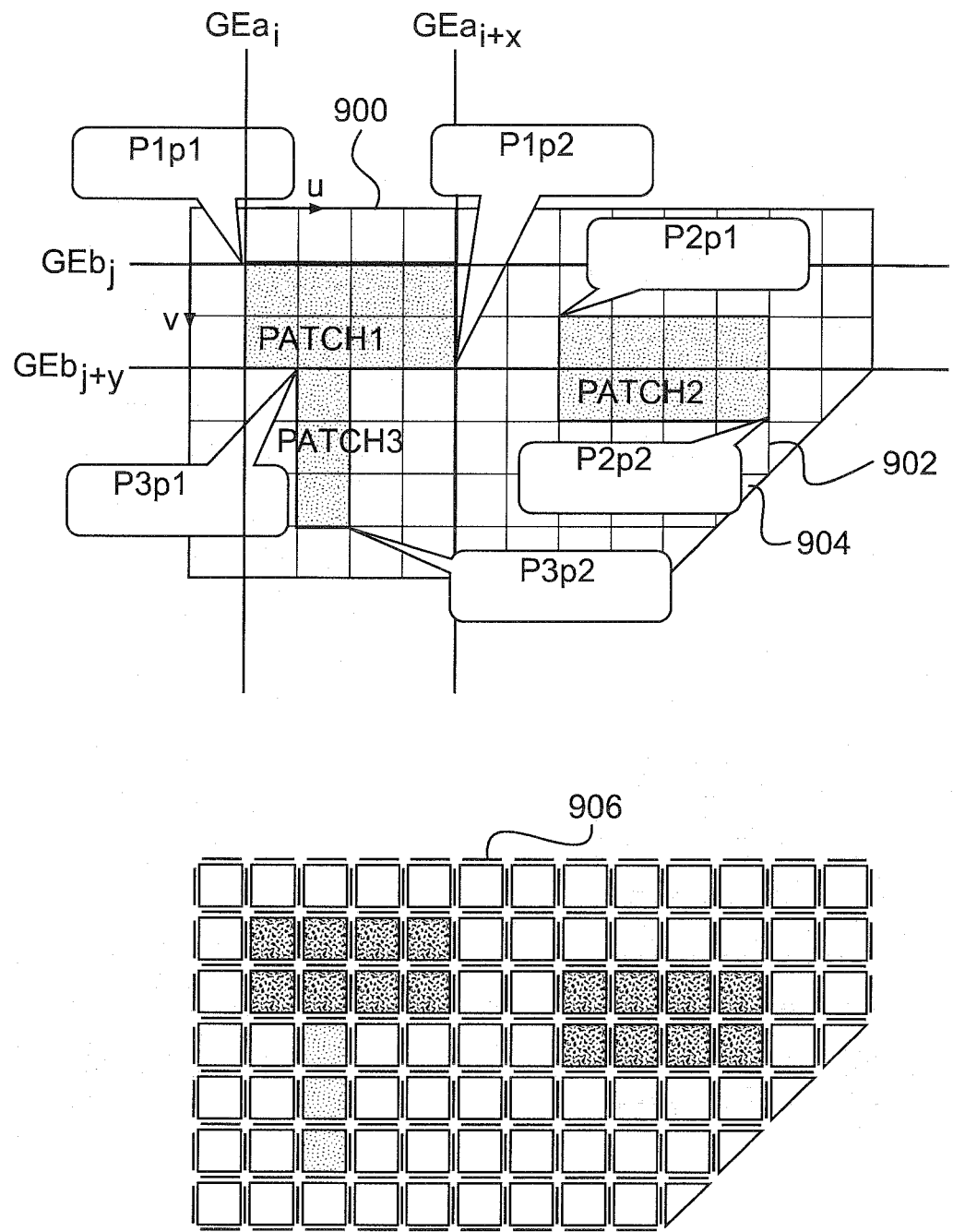
FIG. 9 schematically illustrates a second example of the application of the invention on a two-dimensional element.

FIG. 9 schematically illustrates a second example of the application of the invention on a two-dimensional element, in particular the use of patches allowing associating several property data with a geometrical entity. This example illustrates also the linking of patches to a finite-element model. In this example, a geometrical entity 900 is an oriented geometrical surface. The surface values 904 of the geometrical entity 900 are positioned by a positioning identifier for surface values. In addition, a plurality of one-dimensional elements 902, for example stiffeners, is laid out on the geometrical entity 900.

Moreover, patches, in this example three: PATCH1, PATCH2 and PATCH3, are positioned on the geometrical entity 900. Each patch comprises at least a property data associated with a portion of the geometrical entity 900. The property data can differ from one patch to another. In an implementation example, the property data of each patch are contained in separated files, the files being in a structured data format, for example the XML format. The positions from these three patches are identified by positioning identifiers of the patches. In this example, the position of the PATCH1 is identified by the positioning identifiers of a zone, the zone being the closed contour composed of the joined edges of the lines $GEa_i$, $GEb_j$, $GEa_{i+x}$, and $GEb_{j+y}$; the position of the PATCH2 is identified by the positioning identifiers of a second zone; and the position of the PATCH3 is identified by the positioning identifiers of a third zone.

A correspondence between the positioning identifiers of patch on the geometrical entity 900 and the elements of the finite-element model 906 is established. The property data of each patch of the geometrical entity 900 are then linked to the finite-element model 906.

A correspondence between the positioning identifiers for surface values and the elements of the finite-element model 906 is established. The surface values 904 of the geometrical entity 900 are then linked to the finite-element model 906.

The establishment of a correspondence and the linking of the property data of the plurality of one-dimensional elements 902 in the finite-element model 906 are carried out according to the applications described with reference to FIGS. 4 to 6.

Figure 10:
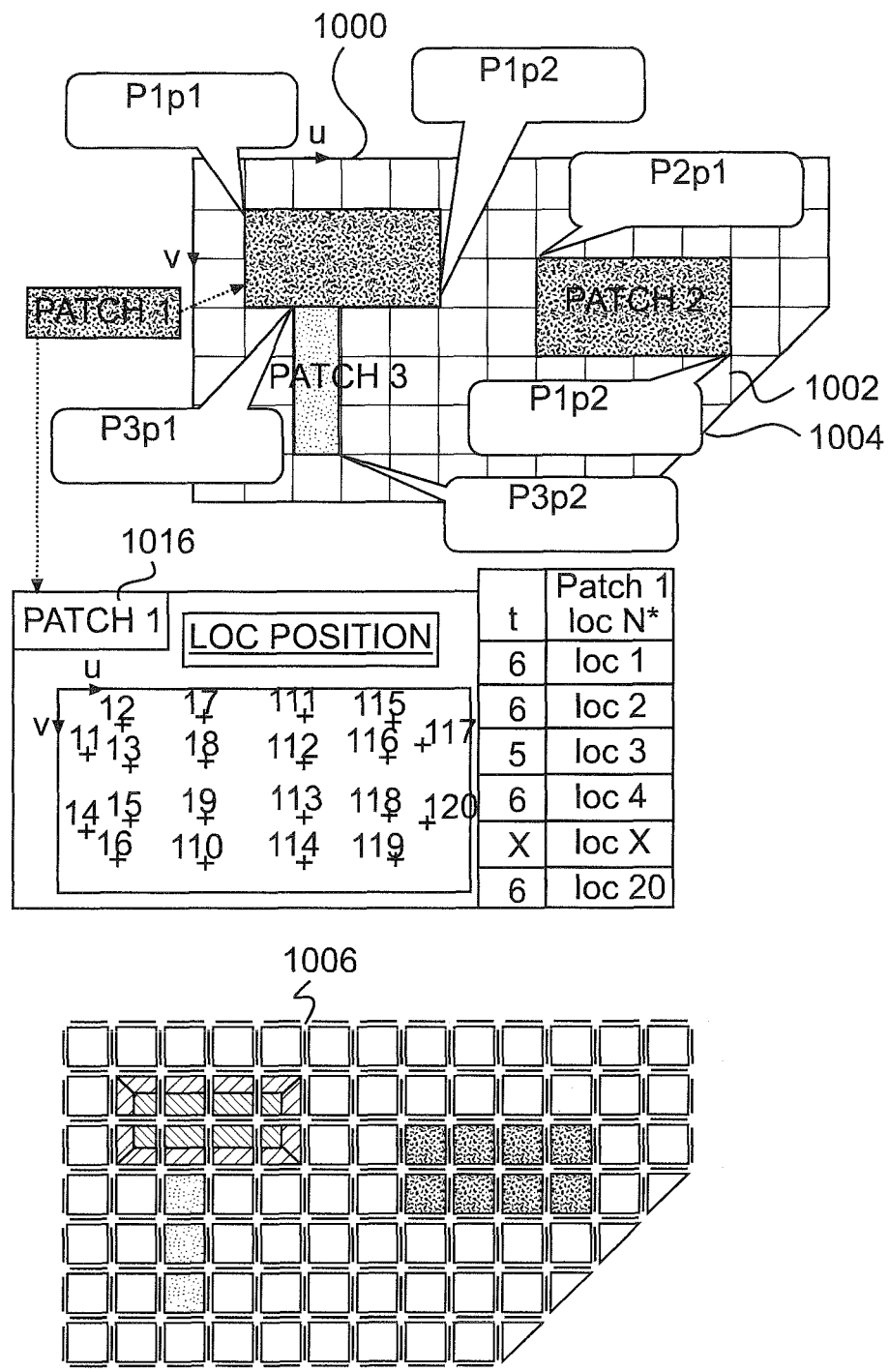
FIG. 10 schematically illustrates a third example of the application of the invention on a two-dimensional element.

FIG. 10 schematically illustrates a third example of the application of the invention on a two-dimensional element, in particular the use of patches and property value localizations allowing associating several property data with a geometrical entity. This example also illustrates the linking of patches and property value localizations to a finite-element model. In this example, a geometrical entity 1000 is an oriented geometrical surface. The surface values 1004 of the geometrical entity 1000 are positioned by a positioning identifier for surface values. In addition, a plurality of one-dimensional elements 1002, for example stiffeners, is laid out on the geometrical entity 1000.

Moreover, patches, in this example three: PATCH1 1016, PATCH2 and PATCH3, are positioned on the geometrical entity 1000. Each patch comprises at least a property data associated with a portion of the geometrical entity 1000. The property data can differ from one patch to another. In an implementation example, the property data of each patch are contained in separated files, the files being in a structured data format, for example the XML format. The positions of these three patches are identified by positioning identifiers for the patches. In this example, the position of the PATCH1 1016 is identified by positioning identifiers of a first zone; the position of the PATCH2 is identified by the positioning identifiers of a second zone; and the position of the PATCH3 is identified by the positioning identifiers of a third zone.

In this example, the PATCH1 1016 is composed of several property value localizations. In this example, each property value localization has its own thickness value. The property value localization can depend on one or more characteristics of the geometrical entity 1000, such as, for example, the center of gravity, a localization of a calculation point, an evolution of release of composite folding, or any other criterion allowing to a user to preserve a data essential to its activity. The positions of the property value localizations in a patch are identified by positioning identifiers for property value localization.

A correspondence between the positioning identifiers for property value localization and the elements of the finite-element model 1006 is established. The values of property localization values are then linked to the finite-element model 1006.

A correspondence between the positioning identifiers for patches on the geometrical entity 1000 and the elements of the finite-element model 1006 is established. The property data of each patch of the geometrical entity 1000 are then linked to the finite-element model 1006.

A correspondence between the positioning identifiers for surface values and the elements of the finite-element model 1006 is established. The surface values 1004 of the geometrical entity 1000 are then linked to the finite-element model 1006.

The establishment of a correspondence and the linking of the property data of the plurality of one-dimensional elements 1002 on the finite-element model 1006 are carried out according to the applications described with reference to FIGS. 4 to 6.

In case the granularity of the finite-element model 1006, i.e. the number of elements constituting the finite-element model, is higher than the number of values of the property data, for example the number of values of property localization values, a rule of correspondence can be used in order to generate new values of property value localizations to be linked to the finite-element model 1006. An example of rule of correspondence could be a thickness calculation based on a voluminal expression of a predetermined zone.

In case a positioning identifier for a property value localization does not correspond to an element of the finite-element model 1006, a choice is proposed to the user, by proposing for example the value of the nearest property value localization or one of the property data of the patch in which the property value localization is positioned. This choice can also be carried out automatically by a rule of correspondence. An example of rule of correspondence could be an average proportional to the distances between two property value localizations. A new value of property value localization linked to an element of the finite-element model 1006 can then be created.

The figures and the description thereof provided hereinbefore illustrate the invention rather than limit its scope. Naturally, in order to meet specific needs, a person skilled in the field of the invention will be able to apply modifications with regard to the description hereinbefore.

Any reference signs in the claims do not limit the claims. The verbs "comprise" and "include" do not exclude the presence of elements other than those listed in the claims. The word "a" preceding an element does not exclude the presence of a plurality by such elements.

The invention claimed is:

1. A method for realization of a finite-element model by a computer, wherein the method comprises:
    generating, using the computer, a finite-element model of a geometric entity, the finite-element model having a particular granularity, wherein modeling the geometric entity includes geometrical coordinates;
    acquiring at least one property data by an interface of said computer, the at least one property data being associated with a discrete position on the geometrical entity independently from the particular granularity of said finite-element model;
    storing said at least one property data in a memory of said computer;
    storing at least one positioning identifier in said memory of said computer, the at least one positioning identifier identifying the discrete position of a corresponding one of said at least one property data on said geometrical entity independently from the particular granularity of said finite-element model;
    establishing a correspondence between said at least one positioning identifier and at least one element of said finite-element model in said memory of said computer using a rule of correspondence wherein the rule of correspondence establishes the correspondence based at least on the geometrical coordinates;
    applying the at least one property data to the finite-element model by linking said at least one property data with said at least one element of said finite-element model for which the rule of correspondence with said positioning identifier of said at least one property data was established in said memory of said computer; and
    modifying the finite element model based on the linking of said at least one property data and said at least one element of said finite-element model, wherein the modification includes updating the property data during creation or modification of at least one element of said finite-element model.

2. The method according to claim 1, wherein the method further comprises a step of modifying by said computer said at least one property data and/or said positioning identifier according to the rule of correspondence.

3. The method according to claim 2, wherein said rule of correspondence is determined by a user by said interface of said computer.

4. The method according to claim 2, wherein said rule of correspondence is selected among a group comprising: an interpolation, a logarithmic interpolation, an average, a weighted average, a calculation thickness based on a voluminal expression of a predetermined zone and an average in proportion to distances between two values.

5. The method according to claim 1, wherein the method further comprises a step of generating by said computer at least one property data and/or a positioning identifier according to the rule of correspondence.

6. The method according to claim 1, wherein a modification of said at least one element of said finite-element model generates at least one property data and/or a positioning identifier according to a rule of correspondence.

7. The method according to claim 1, wherein a creation of an element of said finite-element model generates at least one property data and/or a positioning identifier.

8. The method according to claim 1, wherein the step of acquiring said at least one property data by said interface of said computer is carried out starting from a finite-element model.

9. The method according to claim 1, wherein said geometrical entity is selected among a group comprising: a one-dimensional element and a two-dimensional element.

10. The method according to claim 1, wherein said at least one property data is selected among a group comprising: a normal section, an inertia, a sheared section, a torque, a thickness and a surface value.

11. A device for realization of a finite-element model, the device comprises:
   a processor;
   at least one memory storing program instructions to instruct the device to perform the functions of:
   a module for generating a finite-element model of a geometric entity, the finite-element model having a particular granularity, wherein modeling the geometric entity includes geometrical coordinates;
   an acquisition module for acquiring at least one property data and at least one positioning identifier by an interface of said device in order to store said at least one property data and said at least one positioning identifier in the at least one memory of said device, the at least one property data being associated with a discrete position on a geometrical entity independently from the particular granularity of said finite-element model, said at least one positioning identifier identifying the discrete position of a corresponding one of said at least one property data on said geometrical entity independently from the particular granularity of said finite-element model;
   a correspondence module for establishing a correspondence between said at least one positioning identifier and at least one element of said finite-element model in said memory of said device using a rule of correspondence, wherein the rule of correspondence establishes the correspondence based at least on the geometrical coordinates;
   a linkage module for applying the at least one property data to the finite-element model by linking said at least one property data with said at least one element of said finite-element model for which the rule of correspondence with said positioning identifier of said at least one property data was established in said memory of said computer; and
   a modification module for modifying the finite element model based on the linking of said at least one property data and said at least one element of said finite-element model, wherein the modification includes updating the property data during creation or modification of at least one element of said finite-element model.

12. A non-transitory computer readable medium on which program code instructions are recorded for realization of a finite-element model by a computer, wherein the program code instructions comprise:
   instructions for generating a finite-element model of a geometric entity, the finite-element model having a particular granularity, wherein modeling the geometric entity includes geometrical coordinates;
   acquisition code instructions for acquiring at least one property data and at least one positioning identifier by an interface of said computer in order to store said at least one property data and said at least one positioning identifier in a memory of said computer, the at least one property data being associated with a discrete position on a geometrical entity independently from the particular granularity of said finite-element model, said at least one positioning identifier allowing identifying the discrete position of a corresponding one of said at least one property data on said geometrical entity independently from the particular granularity of said finite-element model; and
   correspondence code instructions for establishing a correspondence between said at least one positioning identifier and at least one element of said finite-element model in said memory of said computer using a rule of correspondence, wherein the rule of correspondence establishes the correspondence based at least on the geometrical coordinates;
   instructions for applying the at least one property data to the finite-element model by linking said at least one property data with said at least one element of said finite-element model for which the rule of correspondence with said positioning identifier of said at least one property data was established in said memory of said computer; and
   instructions for modifying the finite element model based on the linking of said at least one property data and said at least one element of said finite-element model, wherein the modification includes updating the property data during creation or modification of at least one element of said finite-element model.

* * * * *